United States Patent
Shigihara et al.

(10) Patent No.: US 9,929,532 B1
(45) Date of Patent: Mar. 27, 2018

(54) BROAD AREA SEMICONDUCTOR LASER DEVICE

(71) Applicant: Mitsubishi Electric Corporation, Tokyo (JP)

(72) Inventors: Kimio Shigihara, Tokyo (JP); Satoshi Nishikawa, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/623,937

(22) Filed: Jun. 15, 2017

(30) Foreign Application Priority Data

Sep. 13, 2016 (JP) .................. 2016-179018

(51) Int. Cl.
  *H01S 5/20* (2006.01)
  *H01S 5/026* (2006.01)
  *H01S 5/22* (2006.01)

(52) U.S. Cl.
  CPC ............. *H01S 5/026* (2013.01); *H01S 5/22* (2013.01)

(58) Field of Classification Search
  CPC .................... H01S 5/22; H01S 5/026
  USPC ................ 372/23, 43.01; 359/328
  See application file for complete search history.

(56) References Cited

U.S. PATENT DOCUMENTS

| 5,894,492 A * | 4/1999 | Welch ............... H01S 5/026 359/344 |
| 2007/0230527 A1* | 10/2007 | Sakai ............... H01S 5/141 372/43.01 |
| 2008/0310470 A1* | 12/2008 | Ooi ............... B82Y 20/00 372/44.01 |

FOREIGN PATENT DOCUMENTS

JP  H08-264884 A  10/1996

OTHER PUBLICATIONS

Platz et al.; 940-nm Broad Area Diode Lasers Optimized for High Pulse-Power Fiber Coupled Applications; IEEE Photonics Technology Letters; Mar. 15, 2014; pp. 625-628; vol. 26, No. 6.

* cited by examiner

*Primary Examiner* — Tuan Nguyen
(74) *Attorney, Agent, or Firm* — Studebaker & Brackett PC

(57) ABSTRACT

A broad area semiconductor laser device includes a waveguide region and a filter region. The waveguide region includes an active region into which current is injected, and a cladding region that sandwiches the active region. The active region either protrudes or is recessed with respect to the filter region, so as to promote the divergence of higher order modes in the filter region.

19 Claims, 14 Drawing Sheets

BROAD AREA SEMICONDUCTOR LASER DEVICE

BACKGROUND OF THE INVENTION

Field of the Invention

The present invention relates to a broad area semiconductor laser device.

Background Art

Non-patent Literature "R. Platz et. al., "940-nm Broad Area Diode Lasers optimized for High Pulse-Power Fiber Coupled Applications", IEEE Photonics Technology Letters., Vol. 26, No. 6, pp. 625-628, 2014" describes letting outgoing light from a broad area semiconductor laser device into a multi-mode fiber, and using the outgoing light from the fiber for an excitation light source or direct usage or the like. Optic fiber is flexible so that the direction in which light is emitted from the fiber can be freely changed.

With optic fiber, the numerical aperture (NA), which is determined by the refractive index of the core and the refractive index of the cladding, can be defined. Thus, even if light having an incidence angle greater than the NA enters the optic fiber, it will end up escaping through cladding. Therefore, there is a need to reduce the divergence angle of light emitted from a broad area semiconductor device.

Japanese Unexamined Patent Application Publication No. H8-264884 describes interrupting a waveguide at a rear end surface inside a resonator in order to reduce a beam divergence angle in the horizontal direction of a gain waveguide type semiconductor laser device.

According to the method recited in Patent Literature 1, since the diffraction effect of the higher order modes is weak, it is necessary to lengthen a region where there is no waveguide, in order to suppress higher order mode oscillation and reduce the horizontal divergence angle. Since current is not typically injected into a region where there is no waveguide, lengthening this region would result in an increase in loss. Such an increase in loss would in turn lead to a deterioration of properties, such as an increase in threshold current and a decrease in slope efficiency of the semiconductor laser device.

Conventional gain waveguide type broad area semiconductor laser devices simply provide a filter region into which current is not injected, near an end surface, or provide a waveguide structure that narrows in a tapered shape toward an end surface. In such a semiconductor laser device, it is necessary to increase the length of the filter region in order to sufficiently diverge the light in the filter region and selectively suppress oscillation of the higher order modes. Increasing the length of the filter region, however, leads to a deterioration of properties such as an increase in the threshold current, and a decrease in the slope efficiency.

SUMMARY OF THE INVENTION

In view of such problems, the present invention provides a broad area semiconductor laser device that is capable of suppressing higher order modes without increasing the length of a filter region.

The features and advantages of the present invention may be summarized as follows.

According to one aspect of the present invention, a refractive index waveguide type broad area semiconductor laser device includes a resonator that has a front end surface and a rear end surface, and includes a waveguide region and a filter region, wherein an effective refractive index of the waveguide region is smaller than an effective refractive index of the filter region, the waveguide region includes an active region that has a width of W and a refractive index of $n_a$, and into which current is injected, and a cladding region that is provided to an outside of the active region, and has a refractive index of $n_c$ that is smaller than the $n_a$, the filter region has an effective refractive index that is uniform in a direction perpendicular to a longitudinal direction of the resonator, a plurality of modes are allowed by the expression below being satisfied, when a wavelength of a laser beam emitted from the resonator is $\lambda$, and the active region protrudes with respect to the filter region when viewed from above.

$$\left[\frac{2\pi}{\lambda}\right]\sqrt{n_a^2 - n_c^2}\left[\frac{W}{2}\right] > \frac{\pi}{2} \qquad \text{Expression}$$

According to another aspect of the present invention, a refractive index waveguide type broad area semiconductor laser device includes a resonator that has a front end surface and a rear end surface, and includes a waveguide region and a filter region, wherein an effective refractive index of the waveguide region is larger than an effective refractive index of the filter region, the waveguide region includes an active region that has a width of W and a refractive index of $n_a$, and into which current is injected, and a cladding region that is provided to an outside of the active region, and has a refractive index of $n_c$ that is smaller than the $n_a$, a plurality of modes are allowed by the expression below being satisfied, when a wavelength of a laser beam emitted from the resonator is $\lambda$, and the filter region protrudes with respect to the active region when viewed from above.

$$\left[\frac{2\pi}{\lambda}\right]\sqrt{n_a^2 - n_c^2}\left[\frac{W}{2}\right] > \frac{\pi}{2} \qquad \text{Expression}$$

According to another aspect of the present invention, a gain waveguide type broad area semiconductor laser device includes a resonator that has a front end surface and a rear end surface, and includes a waveguide region, and a filter region into which current is not injected, wherein the waveguide region includes an active region into which current is injected, and a cladding region that is provided to an outside of the active region and into which current is not injected, and the filter region protrudes with respect to the active region when viewed from above.

Other and further objects, features and advantages of the invention will appear more fully from the following description.

DETAILED DESCRIPTION OF THE PREFERRED EMBODIMENTS

A broad area semiconductor laser device according to embodiments of the present invention will now be described with reference to the accompanying drawings. Like or corresponding constituent elements are denoted by like reference signs, and repetitive descriptions may be omitted.

First Embodiment

Figure 1:
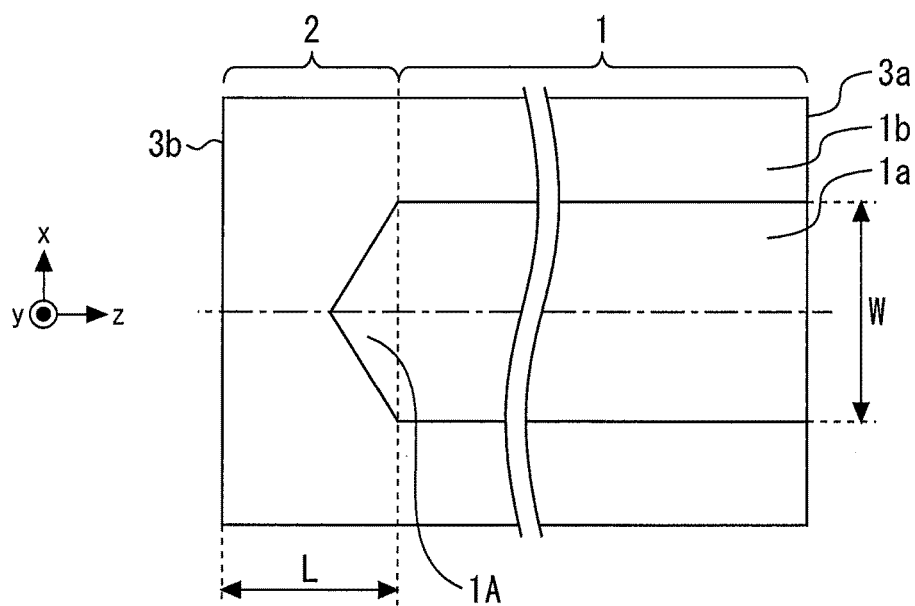
FIG. 1 is a plan view of a broad area semiconductor laser device according to a first embodiment.

FIG. 1 is a plan view of a broad area semiconductor laser device according to a first embodiment. This laser device is a refractive index waveguide type broad area semiconductor laser device. FIG. 1 is a plan view, i.e., a view of the broad area semiconductor laser device from a crystal grown surface side. This broad area semiconductor laser device has a waveguide region 1 with an effective refractive index of ne, and a filter region 2 with an effective refractive index of nf. The effective refractive index is a refractive index in which light can be substantially felt, and may be obtained by an equivalent refractive index method or the like based on a layer thickness and composition of layers in the crystal growth direction, and the width of the active region. The effective refractive index ne of the waveguide region 1 is smaller than the effective refractive index nf of the filter region 2. In other words, ne<nf. The waveguide region 1 and the filter region 2 form a resonator that has a front end surface 3a and a rear end surface 3b. The filter region 2 is a region having a length of L, which contacts the rear end surface 3b, and has a uniform effective refractive index in a direction perpendicular to the longitudinal direction of the resonator. Current is not injected into the filter region 2. A direction parallel to the end surfaces of the semiconductor laser device will be denoted x, the crystal growth direction will be denoted y, and the direction perpendicular to the end surfaces of the semiconductor laser device will be denoted z. The end surfaces refer to the front end surface 3a and the rear end surface 3b.

The waveguide region 1 includes an active region 1a and a cladding region 1b. The active region 1a has a width of W, and a refractive index of $n_a$. Current is injected into the active region 1a. The cladding region 1b is provided to the outside of the active region 1a, and has a refractive index of $n_c$ that is smaller than the $n_a$. The active region 1a has a protruding portion 1A that protrudes with respect to the filter region 2 when viewed from above. The protruding portion 1A is wedge-shaped toward the rear end surface 3b. The boundary between the active region 1a and the filter region 2 is linear. By providing the protruding portion 1A, two straight lines form the boundary between the active region 1a and the filter region 2.

With the broad area semiconductor laser device, a plurality of modes are allowed in the horizontal direction, i.e., the x direction. The conditions for allowing multi-modes are described on pages 18 to 31 in a technical book entitled "Optical Waveguides" (author: Shojiro Kawakami, Asakura Publishing Co., Ltd. (1982)), for example. That is, in order for a plurality of modes to be allowed, Expression 1 below must be satisfied, when the wavelength of a laser beam emitted from a broad area semiconductor laser device is λ, the width of the active region 1a is W, the refractive index of the active region 1a is $n_a$, and the refractive index of the cladding region 1b is $$V \equiv \left[\frac{2\pi}{\lambda}\right]\sqrt{n_a^2 - n_c^2}\left[\frac{W}{2}\right] > \frac{\pi}{2} \qquad \text{Expression 1}$$

V is a value referred to as a normalized frequency. A refractive index waveguide type broad area semiconductor laser device that allows a plurality of modes and oscillates in multi-modes is realized by setting the width W of the active region 1a, the refractive index $n_a$ of the active region 1a, and the refractive index $n_c$ of the cladding region 1b, such that the value of this V is greater than π/2.

Figure 2:
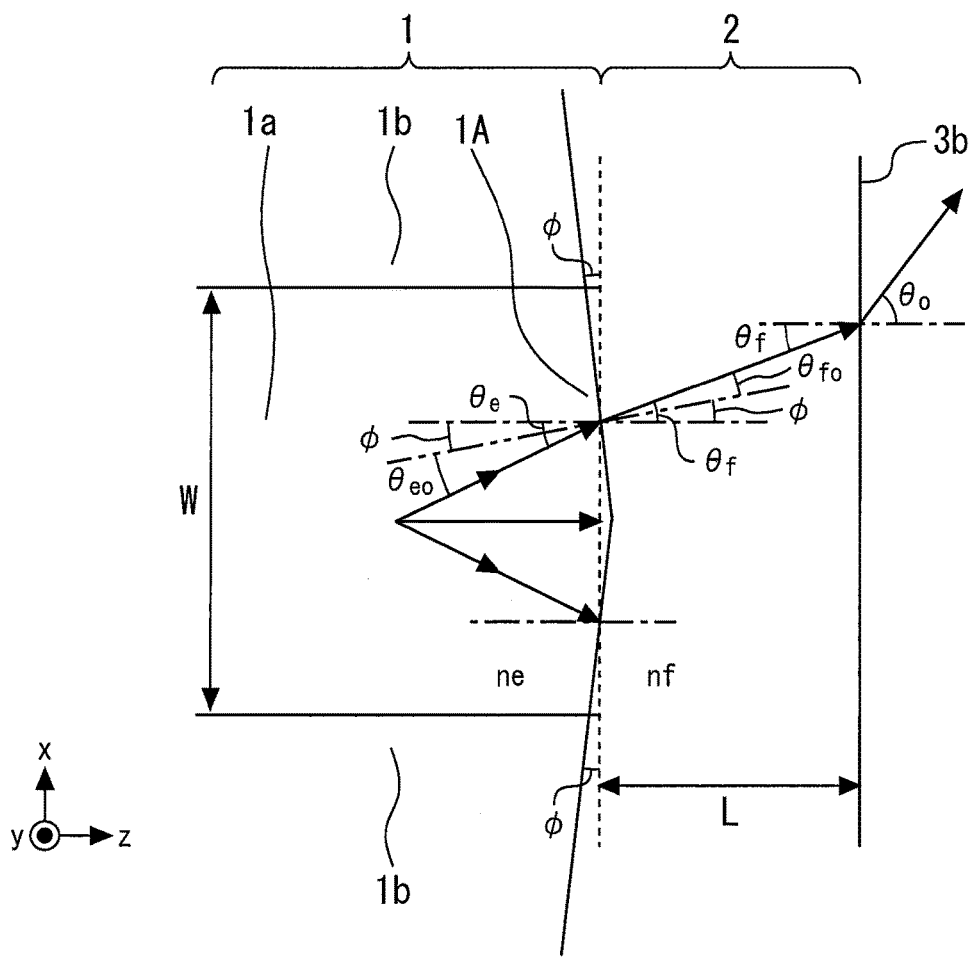
FIG. 2 is a view illustrating the refraction of light.

FIG. 2 is a view illustrating the refraction of light traveling from the waveguide region 1 to the filter region 2. The ability to suppress higher order modes by providing the protruding portion 1A on the active region 1a will now be described. As described above, the effective refractive index ne of the waveguide region 1 is smaller than the effective refractive index nf of the filter region 2. By providing the protruding portion 1A on the active region 1a, an end portion of the active region 1a is inclined by φ with respect to the x-axis. As a result of this angle of inclination φ, an incidence angle θe of the waveguide region 1 is a value obtained by adding the φ to the incidence angle θeo when φ=0. That is, θe=θeo+φ. Similarly, an angle of refraction θf of the filter region 2 is a value obtained by adding the φ to an angle of refraction θfo when φ=0. That is, θf=θfo+φ.

In the waveguide region 1, the light in the waveguide mode travels at a propagation constant β in the z direction while totally reflecting between the active region 1a and the cladding region 1b. The propagation constant β increases as the order of mode is lower and decreases as the order of mode is higher. Also, the waveguide mode that propagates at the propagation constant β in the z direction can be expressed by two plane waves that propagate at a wavenumber k+ and wavenumber k− through the xz planes. Hereinafter, the plane wave of the wavenumber k+ will be considered, but the plane wave of the wavenumber k− may be considered in the same way.

The incidence angle θe of the waveguide region 1 becomes smaller as the order of mode is lower and larger as the order of mode is higher. Light reaches the rear end surface 3b after being refracted to the angle θf by Snell's law at the filter region 2. Some of the light is reflected at the angle θf by the rear end surface 3b, and the rest is diffracted outside the resonator at the angle θo. The light that is reflected by the rear end surface 3b reaches the waveguide region 1 where it couples with the waveguide mode and travels in the −z direction. At this time, since the light diverges more in the positive and negative directions of x in the filter region 2 as the order of mode is higher, a tendency of coupling with the waveguide mode of the waveguide region 1 decreases in higher order modes, and consequently, a large coupling loss will occur. With the semiconductor laser device, since oscillation occurs when the gain and loss are balanced, oscillation will tend not to occur in higher order modes.

In the first embodiment of the present invention, the protruding portion 1A is provided on the active region 1a, and the end portion of the active region 1a is inclined by the φ with respect to the x-axis. Therefore, the angle of refraction θf of the filter region 2 can be made θfo+φ, which is a value greater than θfo. Thus, since higher order modes can sufficiently diverge at the filter region 2, higher order modes will tend not to couple with the waveguide mode of the waveguide region 1, and consequently, large coupling loss will occur. That is, higher order modes are able to be suppressed by providing the protruding portion 1A in the active region 1a. By reducing the number of horizontal transverse modes with the suppression of higher order modes, the horizontal beam divergence angle can be reduced and the luminance in the horizontal direction can be increased.

Figure 3:
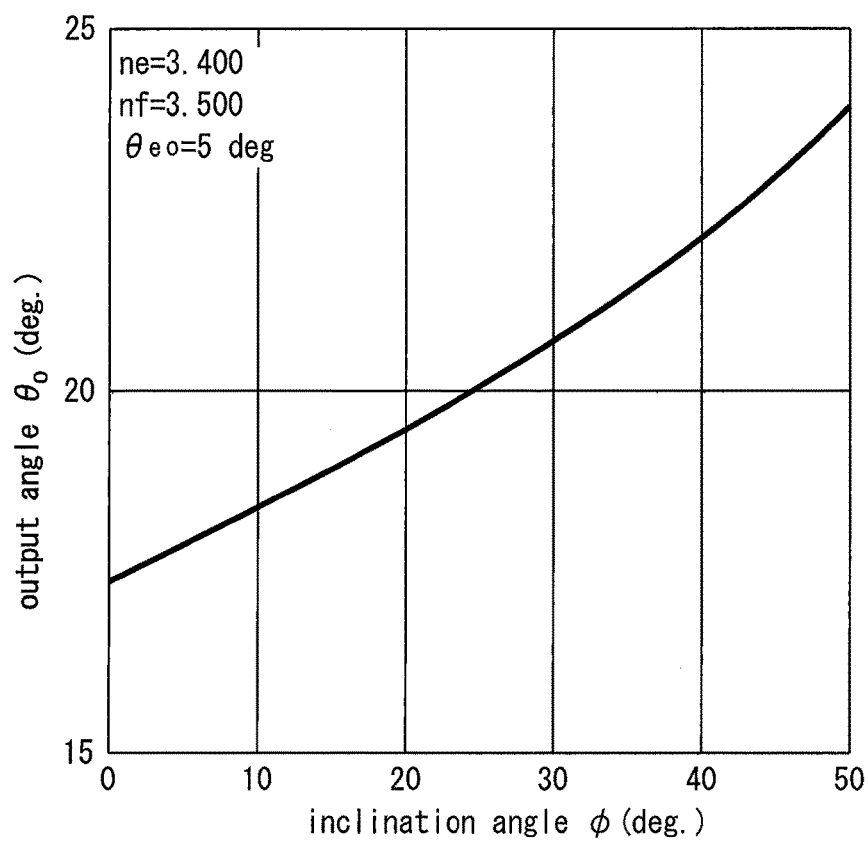
FIG. 3 is a view illustrating the relationship between the inclination angle of the end portion of the active region and the output angle.

FIG. 3 is a view illustrating the relationship between the inclination angle φ of the end portion of the active region, and the output angle θo. FIG. 3 shows the dependence on the inclination angle φ of the output angle θo from the laser device, when the effective refractive index ne of the waveguide region 1 is 3.400, the effective refractive index nf of the filter region 2 is 3.500, and the incidence angle θeo of the waveguide region 1 of the waveguide mode is 5°.

It is evident from FIG. 3 that the output angle θo monotonically increases when the inclination angle φ0 increases. An increase in the output angle θo means that the reflection angle θf of the end surface of the semiconductor laser device is larger. A large reflection angle θf means that when light reflected by the end surface of the semiconductor laser device reaches the waveguide region 1, that light greatly diverges. Therefore, it is possible to increase a so-called filter effect in which light is less apt to couple with the waveguide mode in the waveguide region 1 the greater the inclination θ is. Since the incidence angle θeo of the waveguide region 1 is larger as the order of mode is higher, i.e., in higher order modes, this filter effect becomes remarkable as the order of mode is higher.

An increase in the divergence of light in the filter region 2 due to refraction of the light also acts on lower order modes, and leads to an increase in the output angle of these lower order modes. By disposing the filter region 2 on the rear end surface 3b, a lower order mode is selected in the filter region 2, and the selected lower order mode can be output from the front end surface 3a without being excessively refracted. Therefore, the filter region 2 is preferably disposed on the rear end surface 3b.

When the end portion of the active region 1a is provided with the inclination angle φ, since the effect of suppressing higher order modes can be increased compared to when the inclination angle φ is 0, the length L of the filter region 2 can be shortened. Shortening the length L of the filter region 2 enables the loss in the semiconductor laser device to be reduced, which in turn makes possible to suppress a deterioration of properties, such as an increase in the threshold current and a decrease in the slope efficiency.

Figure 4:
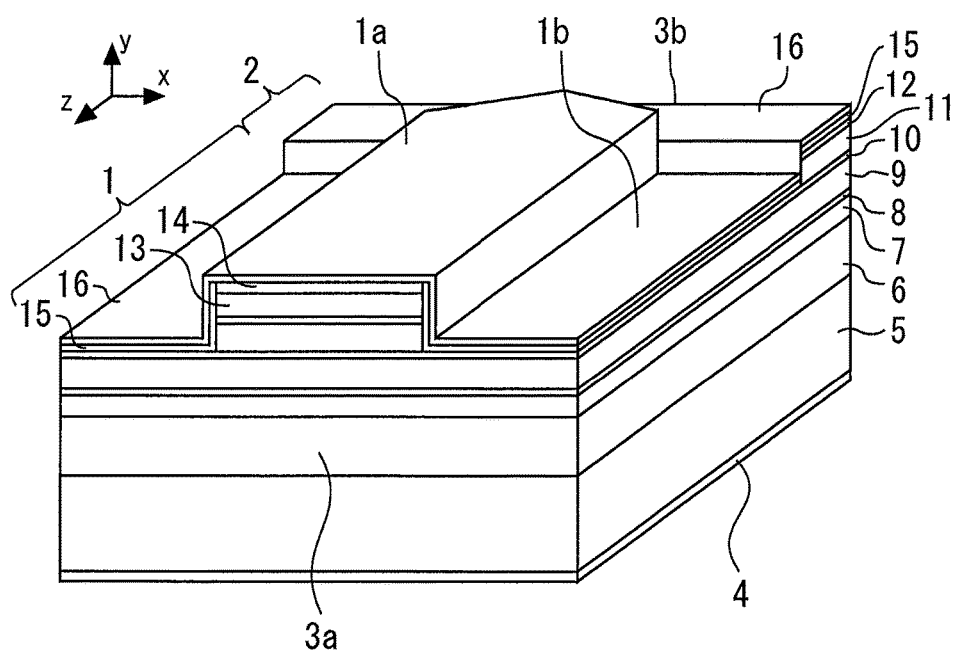
FIG. 4 is a perspective view of the broad area semiconductor laser device according to the first embodiment.

FIG. 4 is a perspective view of the broad area semiconductor laser device according to the first embodiment of the present invention. FIG. 4 shows one example of a structure in which the effective refractive index ne of the waveguide region 1 is smaller than the effective refractive index nf of the filter region 2. An n-electrode 4 is provided on a back surface side of a substrate 5 formed of n-type GaAs. A cladding layer 6 formed of n-type AlGaAs is provided on the substrate 5. A guide layer 7 formed of undoped AlGaAs is provided on the cladding layer 6. An active layer 8 formed of undoped InGaAs is provided on the guide layer 7. A guide layer 9 formed of undoped AlGaAs is provided on the active layer 8. A first etching stopper layer 10 formed of p-type AlGaAs is provided on the guide layer 9.

In the filter region 2, a first cladding layer 11 formed of p-type AlGaAs is provided on the first etching stopper layer 10. In the filter region 2, a second etching stopper layer 12 formed of p-type AlGaAs is provided on the first cladding layer 11. In the filter region 2, a SiN film 15 is provided on the second etching stopper layer 12. In the filter region 2, a p-electrode 16 is provided on the SiN film 15.

In the cladding region 1b, the SiN film 15 is formed on the first etching stopper layer 10. In the cladding region 1b, the p-electrode 16 is provided on the SiN film 15.

In the active region 1a, the first cladding layer 11 is provided on the first etching stopper layer 10. In the active region 1a, the second etching stopper layer 12 is provided on the first cladding layer 11. In the active region 1a, a second cladding layer 13 formed of p-type AlGaAs is provided on the second etching stopper layer 12. In the active region 1a, a contact layer 14 formed of p-GaAs is provided on the second cladding layer 13. The p-electrode 16 is provided on this contact layer 14.

One example of a method for manufacturing this broad area semiconductor laser device will now be described. First, the cladding layer 6, the guide layer 7, the active layer 8, the guide layer 9, the first etching stopper layer 10, the first cladding layer 11, the second etching stopper layer 12, the second cladding layer 13, and the contact layer 14 are sequentially crystal grown on the substrate 5 by metal organic chemical vapor deposition (MOCVD). Next, the active region 1a is covered by a resist or the like, and the portion that is exposed from the resist is etched all the way to the second etching stopper layer 12. Further, the filter region 2 is covered by a resist or the like, and the cladding region 1b is etched all the way to the first etching stopper layer 10.

After all the resists have been peeled away, only the active region 1a is covered by a resist, and the SiN film 15 is formed on the entire surface, and the SiN film on the active region 1a is removed by liftoff. Then, the p-electrode 16 is formed on the upper surface side of the substrate 5, and the n-electrode 4 is formed on the back surface of the substrate 5, thereby completing the semiconductor laser device.

As the waveguide region 1 is etched deeper than the filter region 2, the effective refractive index ne of the waveguide region 1 is able to be smaller than the effective refractive index nf of the filter region 2. Light is generated inside the active layer 8 by injecting electrons into the active layer 8 from the n-electrode 4 side, and injecting holes into the active layer 8 from the p-electrode 16 side. The laser is oscillated by bouncing that light between the front end surface 3a and the rear end surface 3b. With this structure, current is injected into the waveguide region 1, but current is not injected into the filter region 2 because the entire surface of the filter region 2 is covered by the SiN film 15.

Figure 5:
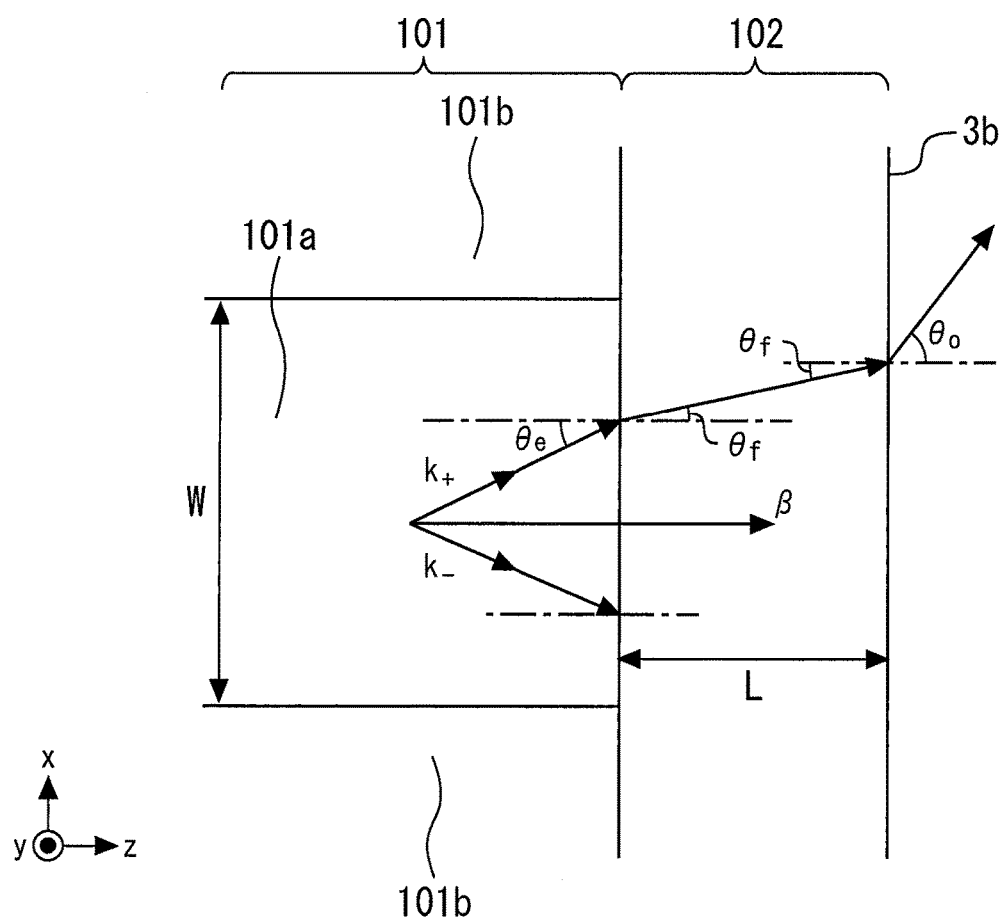
FIG. 5 is a view illustrating the refraction of light of a broad area semiconductor laser device according to the comparative example.

Here, a comparative example will be described to facilitate understanding of the characteristics of the broad area semiconductor laser device according to the first embodiment of the present invention. FIG. 5 is a plan view of a refractive index waveguide type broad area semiconductor laser device according to this comparative example. The device of the comparative example is provided with a waveguide region 101 having an effective refractive index of ne, and a filter region 102 having a length of L and an effective refractive index of nf. The effective refractive index ne is smaller than the effective refractive index nf. The waveguide region 101 includes an active region 101a having a width of W and a refractive index of $n_a$, and a cladding region 101b having a refractive index $n_a$. A boundary between the active region 101a and the filter region 102 is a single straight line that is parallel to the transverse direction of the resonator.

If the incidence angle of the waveguide region 101 is θe, θe becomes smaller as the order of mode is lower and larger as the order of mode is higher. Light reaches the rear end surface 3b after being refracted to the angle θf by Snell's law at the filter region 102. Some of the light is reflected at the angle θf at the rear end surface 3b, and the rest of the light is diffracted outside the resonator at the angle θo. The light that is reflected by the rear end surface 3b reaches the waveguide region 101 where it couples with the waveguide mode and travels in the −z direction.

In this comparative example, since the boundary between the active region 101a and the filter region 102 is not inclined from the x-axis, the angle of refraction θf becomes smaller. Therefore, the divergence of light at the filter region 102 is insufficient, and the length L of the filter region 102 must be increased in order to display the filter effect of suppressing higher order mode oscillation. Since the filter region 102 is typically a region into which current is not injected, increasing the length L would lead to an increase in loss, which would in turn lead to a deterioration of properties, such as an increase in threshold current and a decrease in slope efficiency of the semiconductor laser device.

In contrast, with the first embodiment of the present invention, the angle of refraction θf is increased by providing the protruding portion 1A on the active region 1a as shown in FIG. 1. More specifically, since the inclination angle φ is created by the protruding portion 1A, as shown in FIG. 2, the angle of refraction θf is able to be made to equal the sum of θfo and φ, i.e., θf=θfo+φ. Increasing the angle of refraction makes it possible to suppress higher order modes without increasing the length of the filter region 2.

Figure 6:
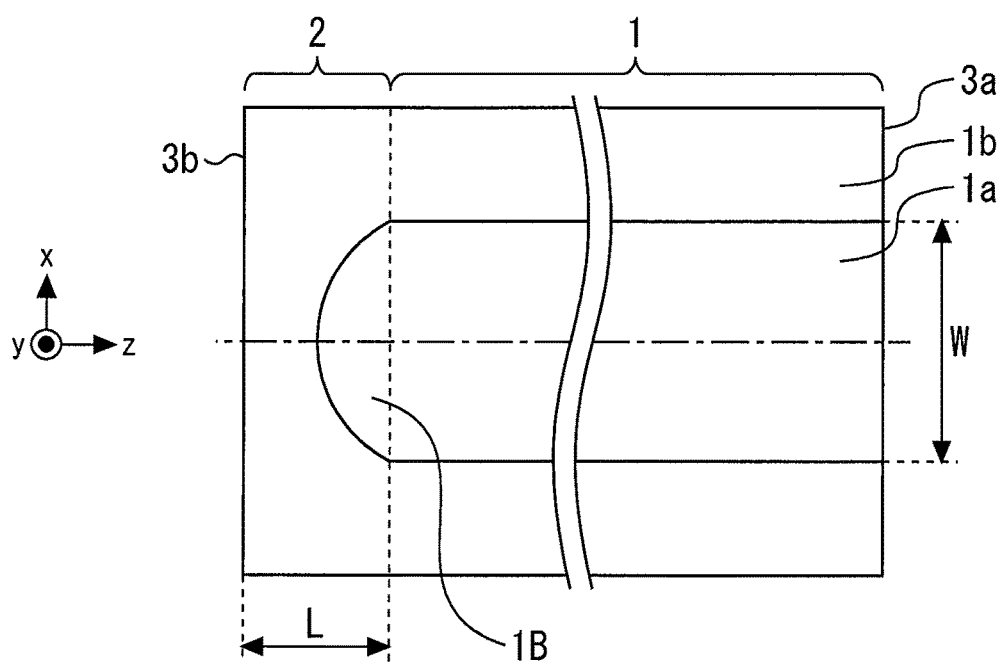
FIG. 6 is a plan view of a device according to a first modified example.

The refractive index waveguide type broad area semiconductor laser device according to the first embodiment of the present invention may by modified in a variety of ways as long as this characteristic is not lost. FIG. 6 is a plan view of a refractive index waveguide type broad area semiconductor laser device according to a first modified example. With this device, the shape of a protruding portion 1B of the active region 1a differs from the shape of the protruding portion 1A shown in FIG. 1. By providing the rounded protruding portion 1B, the boundary between the active region 1a and the filter region 2 is a curve. The angle formed between the normal line of the protruding portion 1B and the z-axis line that is in the length direction of the resonator increases farther away from the center of the protruding portion 1B. Therefore, a greater filter effect can be expected with respect to higher order modes in which light diverges toward the cladding region 1b side, and the length L of the filter region 2 can be shortened.

Figure 7:
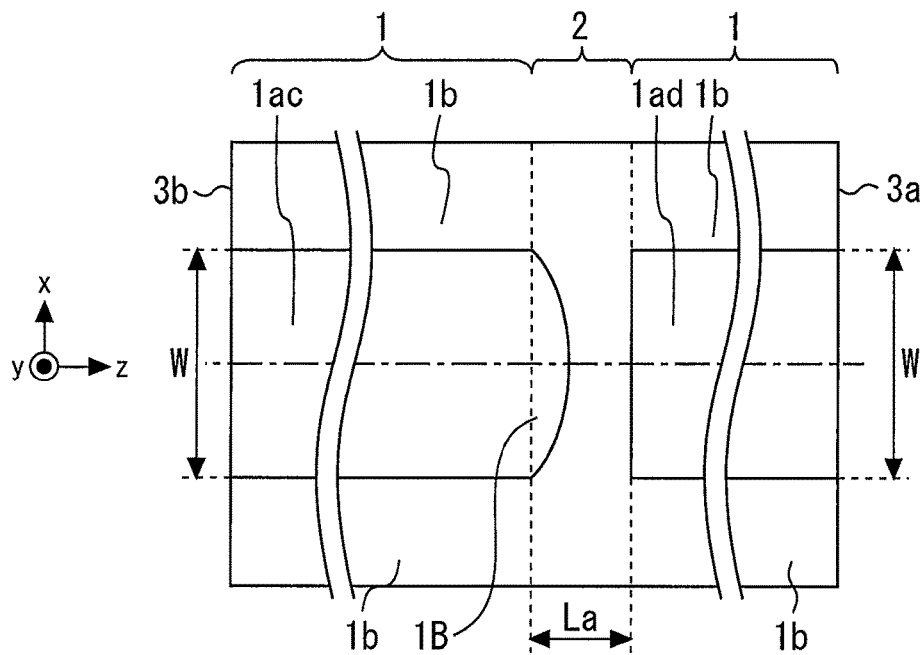
FIG. 7 is a plan view of a device according to a second modified example.

FIG. 7 is a plan view of a refractive index waveguide type broad area semiconductor laser device according to a second modified example. The filter region 2 is provided between two waveguide regions 1. Therefore, the filter region 2 does not contact either the front end surface 3a or the rear end surface 3b. An active region 1ac contacts the rear end surface 3b. The active region 1ac is provided with the protruding portion 1B that protrudes toward the filter region 2. An active region 1ad contacts the front end surface 3a. The portion where the active region 1ad contacts the filter region 2 is flat. The width of each of the active regions 1ac and 1ad is W and the refractive index of each of the active regions 1ac and 1ad is $n_a$. The length of the filter region 2 is La. The effective refractive index ne of the waveguide region 1 is smaller than the effective refractive index nf of the filter region 2.

When a filter region is provided contacting an end surface, some of the laser light reflected by the end surface will not couple with the waveguide. This essentially corresponds to a decrease in the reflectance of the end surface. On the other hand, with the device shown in FIG. 7, since the filter region 2 is provided so as not to contact either the front end surface 3a or the rear end surface 3b, inside the semiconductor laser device, a decrease in reflectance at the end surface can be avoided, while obtaining the same effects as the device according to the first embodiment of the present invention.

Figure 8:
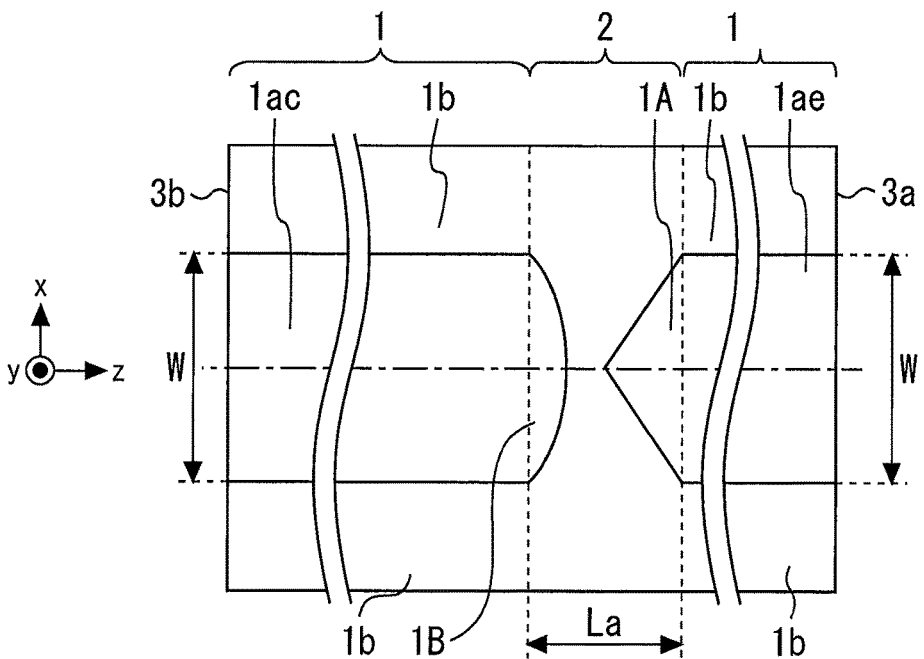
FIG. 8 is a plan view of a device according to a third modified example.

FIG. 8 is a plan view of a refractive index waveguide type broad area semiconductor laser device according to a third modified example. The active region 1ac has the protruding portion 1B, and an active region 1ae has the protruding portion 1A. Accordingly, the active region 1ae protrudes with respect to the filter region 2 at the portion where the active region 1ae contacts the front end surface 3a side of the filter region 2, and the active region 1ac protrudes with respect to the filter region 2 at the portion where the active region 1ac contacts the rear end surface 3b side of the filter region 2.

In the third modified example, since the filter region 2 is provided away from the end surface, a decrease in reflectance at the end surface is able to be suppressed. Furthermore, by providing the protruding portions 1A and 1B, the light output from one of the active regions 1ac and 1ae greatly diverges, and thus will not easily enter the other active region 1ac and 1ae. As a result, a great filter effect can be expected.

Figure 9:
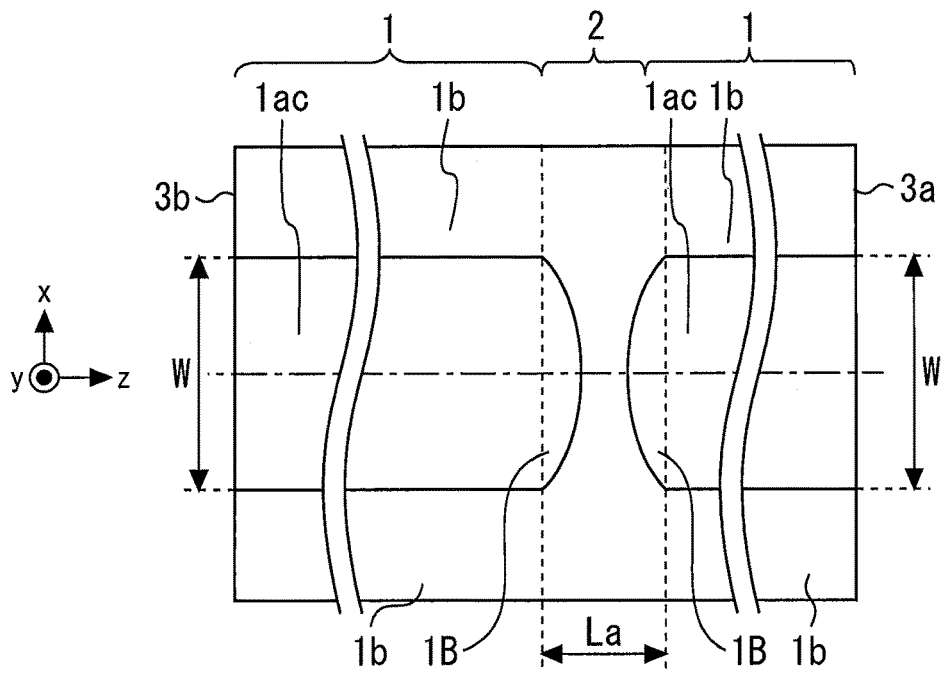
FIG. 9 is a plan view of a device according to a fourth modified example.

FIG. 9 is a plan view of a refractive index waveguide type broad area semiconductor laser device according to a fourth modified example. The filter region 2 is sandwiched in between two active regions 1ac. The two active regions 1ac are each provided with a protruding portion 1B. A decrease in reflectance at the end surface is able to be suppressed by providing the filter region 2 away from the end surface. Providing the two protruding portions 1B results in a remarkable filter effect with respect to higher order modes at the filter region 2. Instead of the two protruding portions 1B, the two protruding portions 1A having two straight lines shown in FIG. 1 may be provided, and the filter region 2 may be sandwiched by these two protruding portions 1A.

In the embodiment of the present invention and all of the modified examples thereof, the shape of the protruding portion of the active region may be changed. The shape of the protruding portion is not particularly limited as long as the normal line of the end portion of the protruding portion is inclined with respect to the z-axis. A structure that differs from the structure shown in FIG. 4 may also be employed to make the effective refractive index ne of the waveguide region 1 smaller than the effective refractive index nf of the filter region 2. These modifications may be suitably applied to the broad area semiconductor laser devices according to the embodiments described below. Since the broad area semiconductor laser devices according to the embodiments below have much in common with the broad area semiconductor laser device according to the first embodiment, the descriptions will focus on the differences with respect to the first embodiment.

Second Embodiment

Figure 10:
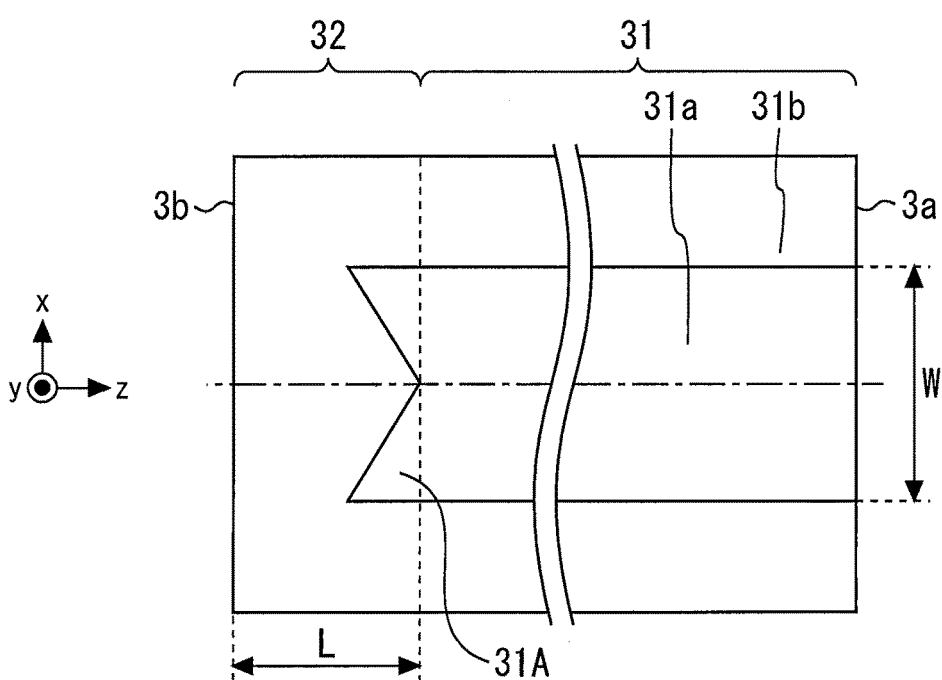
FIG. 10 is a plan view of a refractive index waveguide type broad area semiconductor laser device according to a second embodiment.

FIG. 10 is a plan view of a refractive index waveguide type broad area semiconductor laser device according to a second embodiment. This resonator includes a waveguide region 31, and a filter region 32 provided contacting the rear end surface 3b. The effective refractive index ne of the waveguide region 31 is larger than the effective refractive index nf of the filter region 32. That is, unlike the first embodiment, ne>nf. The waveguide region 31 has an active region 31a and a cladding region 31b. The active region 31a has a width of W and a refractive index of $n_a$. The cladding region 31b is provided to the outside of the active region 31a and has a refractive index of $n_c$ that is smaller than the $n_a$.

The active region 31a has a recessed portion 31A, and thus has a recessed shape with respect to the filter region 32. The active region 31a is wedge-shaped toward the inside of the semiconductor laser device. Providing the recessed portion 31A makes the filter region 32 protrude with respect to the active region 31a with viewed from above. The boundary between the active region 31a and the filter region 32 is linear.

The broad area semiconductor laser device of the second embodiment allows a plurality of modes by satisfying Expression 2 below, when the wavelength of laser light emitted from the resonator is λ.

$$\left[\frac{2\pi}{\lambda}\right]\sqrt{n_a^2 - n_c^2}\left[\frac{W}{2}\right] > \frac{\pi}{2} \qquad \text{Expression 2}$$

Figure 11:
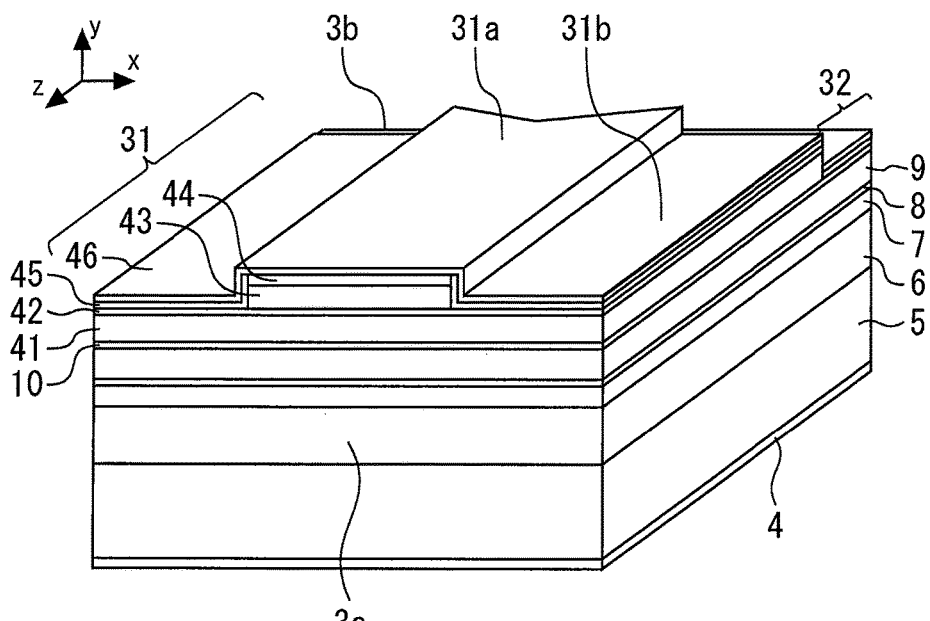
FIG. 11 is a perspective view of the broad area semiconductor laser device according to the second embodiment.

FIG. 11 is a perspective view of the broad area semiconductor laser device according to the second embodiment. FIG. 11 is a perspective view of one example of a structure in which the effective refractive index ne of the waveguide region 31 is larger than the effective refractive index nf of the filter region 32. A first cladding layer 41 formed of p-type AlGaAs is provided on the first etching stopper layer 10 in the waveguide region 31. A second etching stopper layer 42 formed of p-type AlGaAs is provided on the first cladding layer 41 in the waveguide region 31.

In the active region 31a, a second cladding layer 43 formed of p-type AlGaAs is provided on the second etching stopper layer 42. In the active region 31a, a contact layer 44 formed of p-type GaAs is provided on the second cladding layer 43. A SiN film 45, and a p-electrode 46 formed on the SiN film 45, are provided on the front surface of the waveguide region 31.

In the filter region 32, the SiN film 45 is formed on the first etching stopper layer 10, and the p-electrode 46 is provided on the SiN film 45. The other layers are just as described with reference to FIG. 4.

One example of a method for manufacturing the device shown in FIG. 11 will now be described. First, the cladding layer 6, the guide layer 7, the active layer 8, the guide layer 9, the first etching stopper layer 10, the first cladding layer 41, the second etching stopper layer 42, the second cladding layer 43, and the contact layer 44 are sequentially crystal grown on the substrate 5 by metal organic chemical vapor deposition (MOCVD). Next, the active region 31a in the waveguide region 31 is covered by a resist or the like, and the portion that is not covered by the resist is etched all the way to the second etching stopper layer 42. Further, the cladding region 31b is covered by a resist or the like, and the filter region 32 is etched all the way to the first etching stopper layer 10.

Then, after all the resists have been peeled away, only the active region 31a is covered by a resist, and the SiN film 45 is formed on the entire surface, and the SiN film on the active region 31a is removed by liftoff. Lastly, the p-electrode 46 and the n-electrode 4 are formed, thus completing the semiconductor laser device. With this structure, current is injected into the active region 31a of the waveguide region 31, but current is not injected into the filter region 32. However, a portion of the SiN film may be removed and current may be injected into the filter region.

Since the filter region 32 is etched deeper than the waveguide region 31, the effective refractive index nf of the filter region 32 is smaller than the effective refractive index ne of the waveguide region 31. That is, ne>nf. Since the relationship between the effective refractive index ne of the waveguide region 31 and the effective refractive index nf of the filter region 32 is the opposite of what it is in the first embodiment, when the recessed portion 31A is provided such that the active region 31a forms a wedge-shape toward the center of the device, the guided light that propagates through the waveguide region 31 diverges at the filter region 32. Therefore, higher order modes are able to be suppressed without increasing the length of the filter region 2.

With the device according to the second embodiment of the present invention, the distance between a bottom portion of a ridge of the waveguide region 31 and the active layer 8 is longer than it is with the device according to the first embodiment. Therefore, in the case of junction-down assembly, since degradation caused by die bonding is not easily transmitted all the way to the active layer 8, a highly reliable semiconductor laser device is able to be realized.

Figure 12:
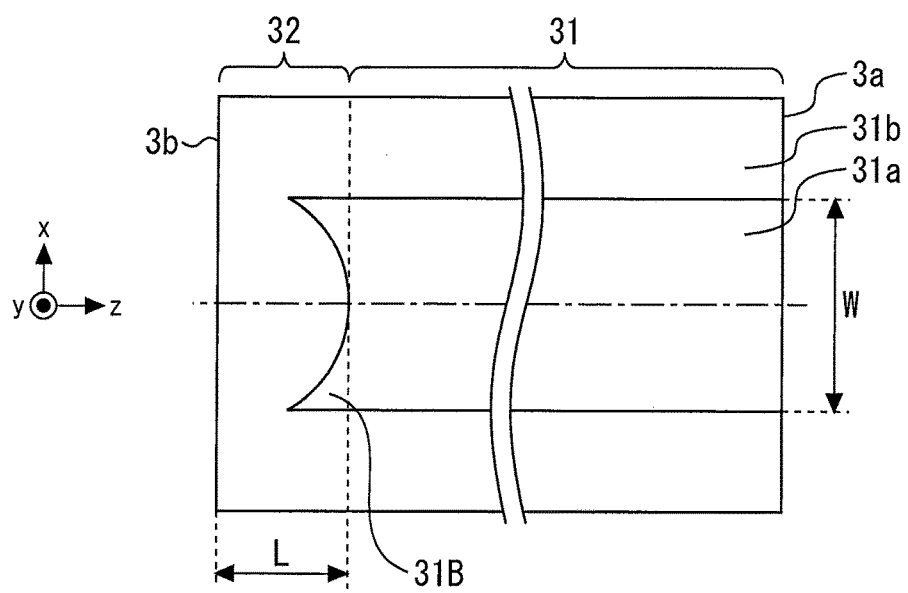
FIG. 12 is a plan view of a device according to a first modified example.

Various modifications of the broad area semiconductor laser device according to the second embodiment are also possible. FIG. 12 is a plan view of a device according to a first modified example of the second embodiment. A recessed portion 31B of the active region 31a is formed rounded. As a result, the boundary between the active region 31a and the filter region 32 is a curve. The normal line of the recessed portion 31B is such that an angle formed with the resonator direction, i.e., the −z direction, increases farther away from the alternate long and short dash line in the center of the active region 31a. Therefore, a great filter effect with respect to higher order modes in which light diverges toward the cladding region side can be expected. Consequently, higher order modes can be suppressed without increasing the length L of the filter region 32.

Figure 13:
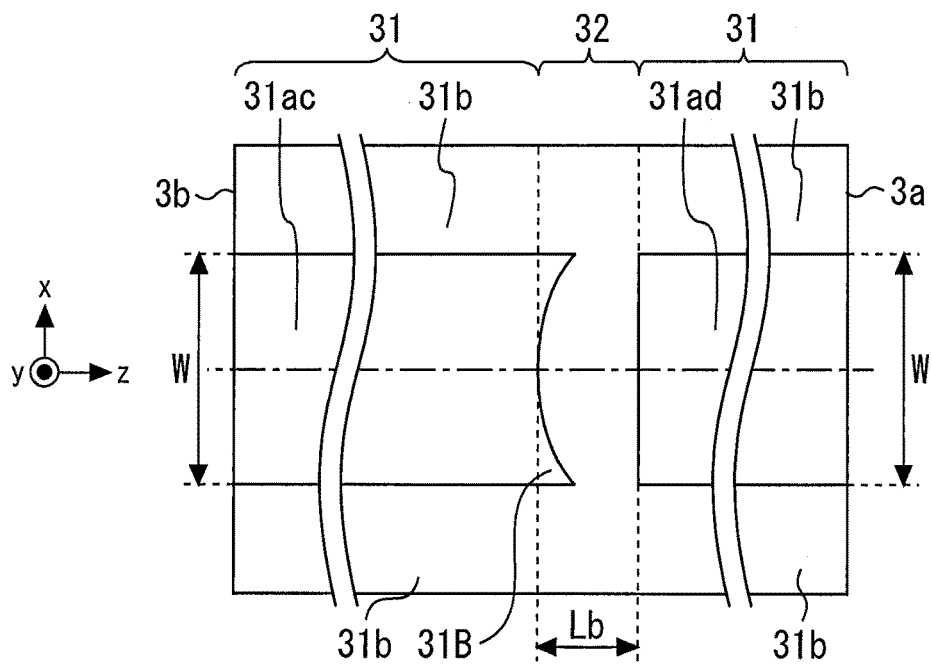
FIG. 13 is a plan view of a device according to a second modified example.

FIG. 13 is a plan view of a device according to a second modified example of the second embodiment. The filter region 32 is sandwiched between an active region 31ac and an active region 31ad. The filter region 32 does not contact either the front end surface 3a or the rear end surface 3b. The active regions 31ac and 31ad are active regions that each have a width of W and a refractive index of $n_a$. The effective refractive index nf of the filter region 32 is smaller than the effective refractive index ne of the waveguide region 31. In addition to being able to suppress higher order modes without increasing a length Lb of the filter region 32, the device in the second modified example is able to prevent a decrease in reflectance at the end surface of the resonator because the filter region 32 is provided away from the end surface.

Figure 14:
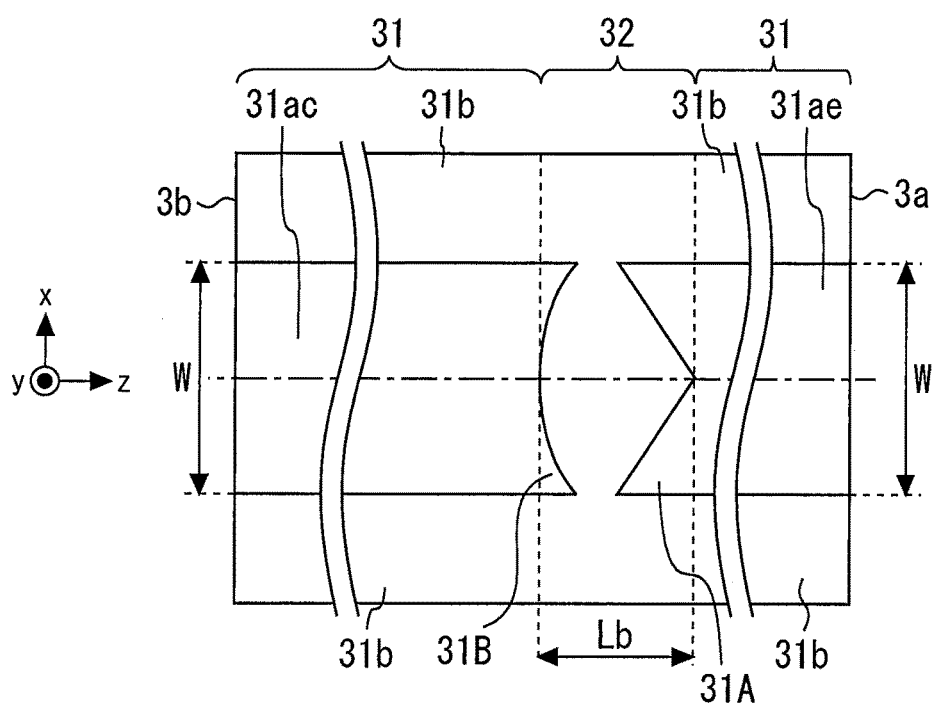
FIG. 14 is a plan view of a device according to a third modified example.

FIG. 14 is a plan view of a device according to a third modified example of the second embodiment. An active region 31ae has the recessed portion 31A at a portion that contacts the filter region 32, and the active region 31ac has the recessed portion 31B at a portion that contacts the filter region 32. Therefore, the filter region 32 protrudes with respect to the active region 31ae on the front end surface 3a side, and protrudes with respect to the active region 31ac on the rear end surface 3b side. The light emitted from the active region 31ae largely diverges, and thus will not easily enter the opposing active region 31ac. As a result, a greater filter effect can be expected.

Figure 15:
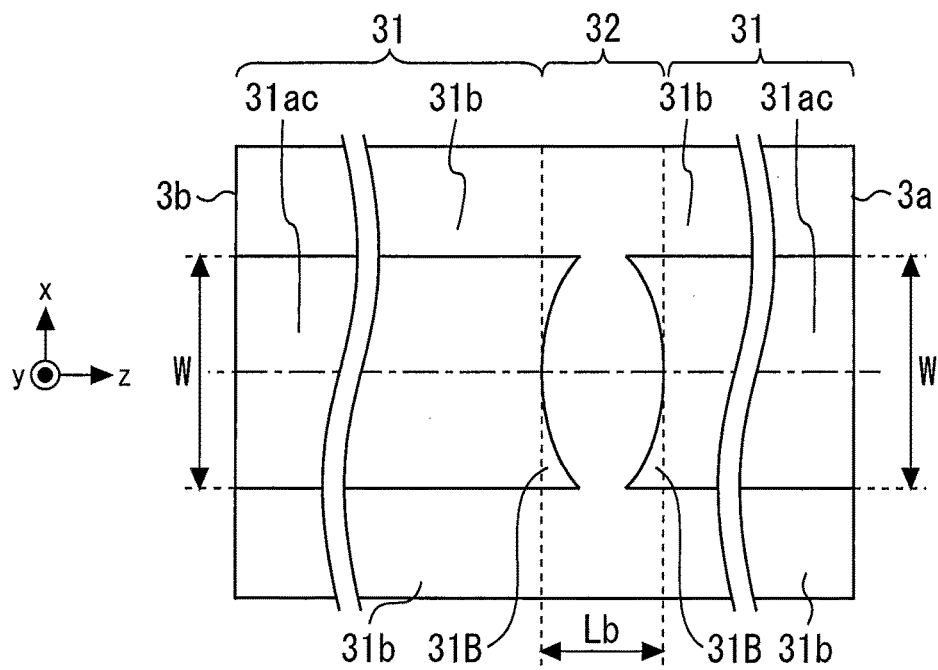
FIG. 15 is a plan view of a device according to a fourth modified example.

FIG. 15 is a plan view of a device according to a fourth modified example of the second embodiment. Two active regions 31ac are both provided with the recessed portion 31B. Since providing two recessed portions 31B increases the divergence of light at the filter region 32, the filter effect with respect to higher order modes can be increased.

With a structure in which the filter region is sandwiched by two active regions, both of the two recessed portions may be shaped just like the recessed portion 31A in FIG. 10. The shapes of the recessed portions are not limited to the examples described above, as long as the normal lines of the end portions of the recessed portions are inclined with respect to the z-axis. Also, a structure that differs from the structure shown in FIG. 11 may also be employed to make the effective refractive index ne of the waveguide region 1 larger than the effective refractive index nf of the filter region 2.

Third Embodiment

Figure 16:
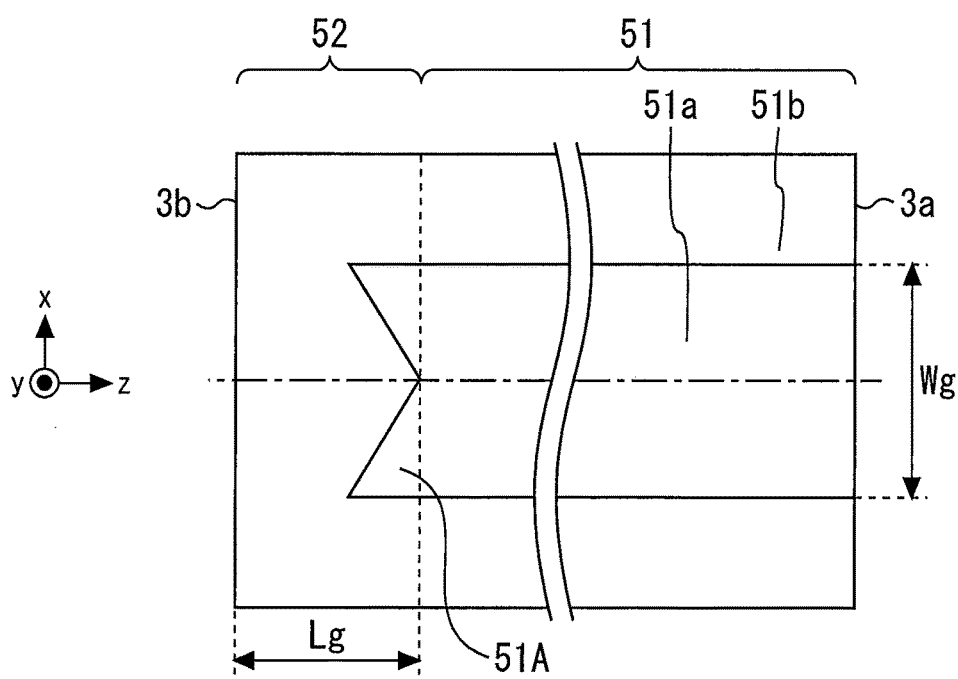
FIG. 16 is a plan view of a broad area semiconductor laser device according to a third embodiment.

FIG. 16 is a plan view of a broad area semiconductor laser device according to a third embodiment. The device according to this third embodiment is a gain waveguide type broad area semiconductor laser device. This device is a resonator that includes a waveguide region 51, and a filter region 52 into which current is not injected. The waveguide region 51 has an active region 51a into which current is injected, and a cladding region 51b that is provided to the outside of the active region 51a and into which current is not injected.

Here, the refractive index when there is gain is expressed by a complex refractive index n*. This complex refractive index can be expressed as shown in Expression 3 below, using a complex relative permittivity $\epsilon^*$.

$$n^{*2} = \epsilon^* \qquad \text{Expression 3}$$

Also, as described on pages 230 to 231 of "Semiconductor Physics (revised edition)" (author: Nobuo Mikoshiba, Baifukan (2001)), the complex relative permittivity $\epsilon^*$ is obtained by dividing the complex permittivity by a permittivity co in free space, and can be expressed as shown in Expression 4 below, when the real part of the relative permittivity is $e_r$, the conductivity is $\sigma$, and the angular frequency is $\omega$.

$$\varepsilon^* = e_r - j\frac{\sigma}{\omega\varepsilon_0} \qquad \text{Expression 4}$$

With the semiconductor laser device, gain is generated to realize $\sigma<0$ and amplify light in the direction of travel, by injecting current into the resonator. Also, a gain waveguide is formed by keeping light in the region into which the current is injected and the gain is generated. That is, the region with the gain acts to keep light in, just like the refractive index waveguide type. However, the gain waveguide becomes the complex refractive index, and thus is unable to simply express the magnitude of the complex refractive index. Therefore, the gain waveguide is differentiated by the magnitude of $|n^{*2}|$. Incidentally, with the refractive index waveguide type, the conductivity $\sigma=0$, so that the complex refractive index is as expressed in Expression 5 below, and ultimately is a real number as shown in Expression 6. The first and second embodiments may also be described with a complex refractive index, but the results are the same and a description will thus be omitted.

$$n^{*2} = \epsilon^* = e_r = n^2 \qquad \text{Expression 5}$$

$$n^* = n \qquad \text{Expression 6}$$

When an effective complex refractive index of the waveguide region 51 of the gain waveguide type broad area semiconductor laser device is ne* and an effective complex refractive index of the filter region 52 of the gain waveguide type broad area semiconductor laser device is nf*, current is injected into the waveguide region 51, so that $\sigma<0$ in the waveguide region 51, and current is not injected into the filter region 52, so that $\sigma=0$ in the filter region 52. Thus naturally, $|ne^{*2}|>|nf^{*2}|$.

The mode of the gain waveguide type broad area semiconductor laser device can be calculated, just like the refractive index waveguide type broad area semiconductor laser device, by referring to the book "Optical Waveguides" described above. Expressions 7 to 9 below are satisfied when there is gain only in the active region 51a, such that $\sigma<0$ in the active region 51a, and there is no gain in the cladding region 51b, such that $\sigma=0$ in the cladding region 51b.

$$u^{*2} + w^{*2} = j\omega(-\sigma)\mu_0\left[\frac{W}{2}\right]^2 \equiv jv^{\sim2} \qquad \text{Expression 7}$$

$$v^{\sim2} = \omega(-\sigma)\mu_0\left[\frac{W}{2}\right]^2 = k_0\sqrt{\frac{\mu_0}{\varepsilon_0}}(-\sigma)\left[\frac{W}{2}\right]^2 \qquad \text{Expression 8}$$

$$w^* = u^*\tan(u^*) \quad \text{[Even mode]}$$
$$w^* = -u^*\cot(u^*) \quad \text{[Odd mode]} \qquad \text{Expression 9}$$

Here, u* is a normalized lateral complex phase constant within the active region, w* is a normalized lateral complex attenuation constant within the cladding region, v~ is a gain waveguide type normalized frequency, co is an angular frequency, $k_o$ is a wavenumber in free space, and $\mu_o$ is the magnetic permeability of the free space.

A multimode oscillation gain waveguide type broad area semiconductor laser device in which a plurality of modes are allowed will be realized as long as at least $\bar{v} > \pi/2$. If $|\sigma|$ increases due to the injection of current, a plurality of modes will be allowed even if the active layer width is narrow. In a typical gain waveguide type semiconductor laser device, multimode oscillation is achieved as long as the active layer width is equal to or greater than 10 µm.

In FIG. 16, the effective complex refractive index of the waveguide region 51 is ne*. The width of the active region 51a is Wg. A recessed portion 51A is formed on a portion of the active region 51a, which contacts the filter region 52. In other words, the active region 51a is wedge-shaped toward the center of the semiconductor laser device. The cladding region 51b is a region that sandwiches the active region 51a. The length of the filter region 52 is Lg, and the effective complex refractive index is nf*. The filter region 52 contacts the rear end surface 3b. Providing the recessed portion 51A makes the filter region 52 protrude with respect to the active region 51a when viewed from above. The boundary between the active region 51a and the filter region 52 is linear. As described above, $|ne^{*2}|$ of the effective complex refractive index of the waveguide region 51 is larger than $|nf^{*2}|$ of the effective complex refractive index of the filter region 52.

Figure 17:
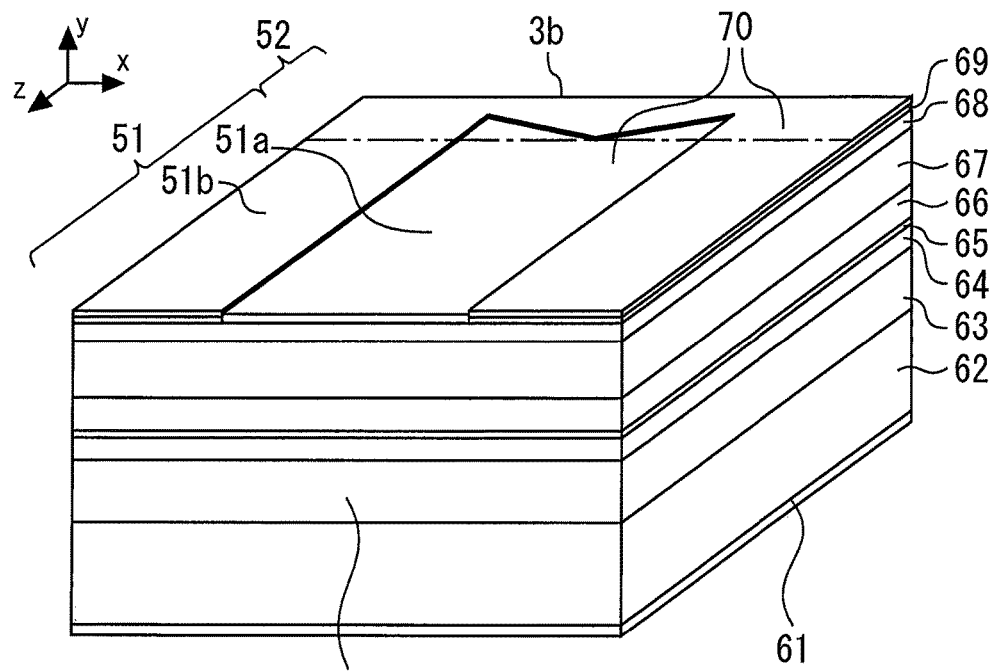
FIG. 17 is a perspective view of the gain waveguide type broad area semiconductor laser device according to the third embodiment.

FIG. 17 is a perspective view of the gain waveguide type broad area semiconductor laser device according to the third embodiment. An n-electrode 61 is provided on a lower surface of a substrate 62 formed of n-type GaAs. A cladding layer 63 formed of n-type AlGaAs is provided on an upper surface of the substrate 62. A guide layer 64 formed of undoped AlGaAs is provided on the cladding layer 63.

An active layer 65 formed of undoped InGaAs is provided on the guide layer 64. A guide layer 66 formed of undoped AlGaAs is provided on the active layer 65. A cladding layer 67 formed of p-type AlGaAs is provided on the guide layer 66. A contact layer 68 formed of p-type GaAs is provided on the cladding layer 67.

A SiN film 69 is formed on the contact layer 68 in the cladding region 51b and the filter region 52. A p-electrode 70 is formed on the SiN film 69 in the cladding region 51b and the filter region 52, and on the contact layer 68 in the active region 51a.

This kind of gain waveguide type broad area semiconductor laser device can be manufactured as described below, for example. First, the cladding layer 63, the guide layer 64, the active layer 65, the guide layer 66, the cladding layer 67, and the contact layer 68 are sequentially crystal grown on the substrate 62 by metal organic chemical vapor deposition (MOCVD). Next, only the active region 51a is covered by a resist, and the SiN film 69 is formed on the entire surface, and then the SiN film on the active region 51a is removed by liftoff. The gain waveguide type broad area semiconductor laser device is then completed by forming the p-electrode 70 on this, and forming the n-electrode 61 on the lower surface of the substrate 62.

The $|ne^{*2}|$ of the effective complex refractive index of the waveguide region 51 is larger than the $|nf^{*2}|$ of the effective complex refractive index of the filter region 52. Therefore, when the recessed portion 51A is provided in the active region 51a such that the filter region 52 protrudes with respect to the active region 51a, the guided light that propagates through the waveguide region 51 diverges at the filter region 52, such that higher order mode oscillation is suppressed, as illustrated in the second embodiment. Thus, only lower order modes are selectively output from the front end surface 3a, thereby creating a beam in which the horizontal divergence angle is small. Also, the gain waveguide type broad area semiconductor laser device is advantageous in that it is extremely easy to manufacture, just as described above.

Figure 18:
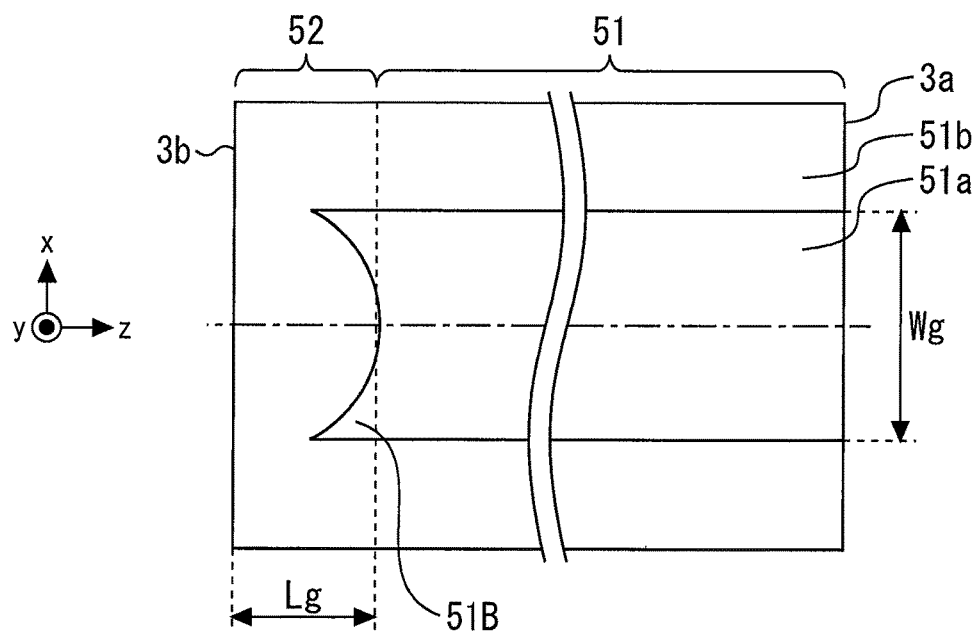
FIG. 18 is a plan view of a device according to a first modified example.

FIG. 18 is a plan view of a gain waveguide type broad area semiconductor laser device according to a first modified example of the third embodiment. An end portion on the rear end surface 3b side of the waveguide region 51 is a recessed portion 51B. This recessed portion 51B causes the boundary between the active region 51a and the filter region 52 to be a curve. The normal line of this boundary is such that the angle formed with the z-axis, i.e., the resonator direction, increases from the center of the active region 51a toward the periphery of the active region 51a. Therefore, a great filter effect with respect to higher order modes in which light diverges toward the cladding region 51b side can be expected. As a result, higher order modes can be suppressed without increasing a length Lg of the filter region 52.

Figure 19:
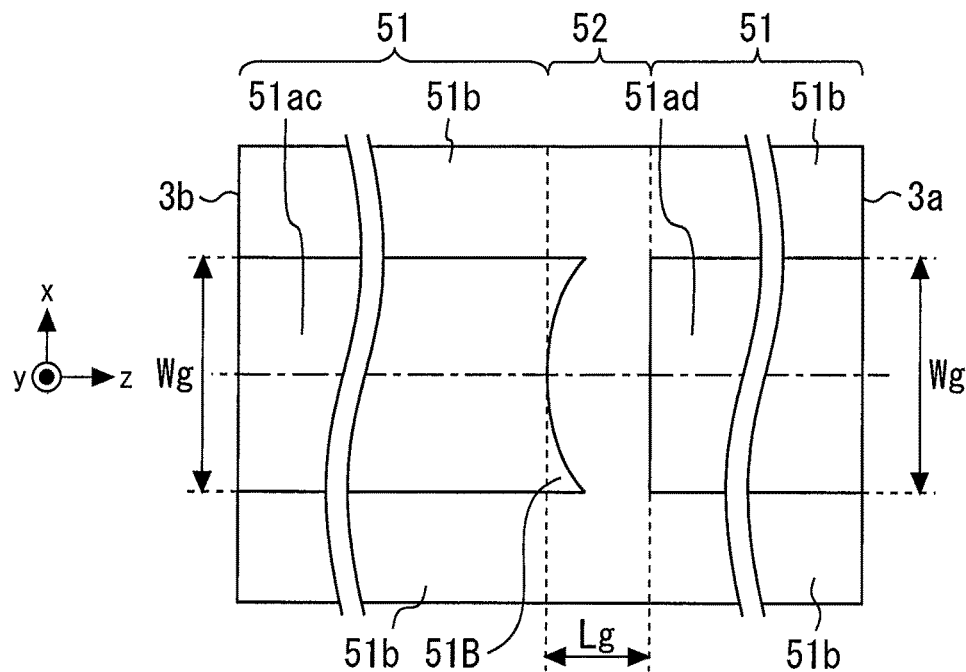
FIG. 19 is a plan view of a device according to a second modified example.

FIG. 19 is a plan view of a gain waveguide type broad area semiconductor laser device according to a second modified example of the third embodiment. The filter region 52 is sandwiched in between two waveguide regions 51, so that the filter region 52 does not contact either the front end surface 3a or the rear end surface 3b. An active region 51ac has the recessed portion 51B at the boundary with the filter region 52. The boundary between the active region 51ad and the filter region 52 is flat. Because the filter region 52 is provided inside the semiconductor laser device and does not contact either the front end surface 3a or the rear end surface 3b, a decrease in the reflectance of the end surface is able to be prevented.

Figure 20:
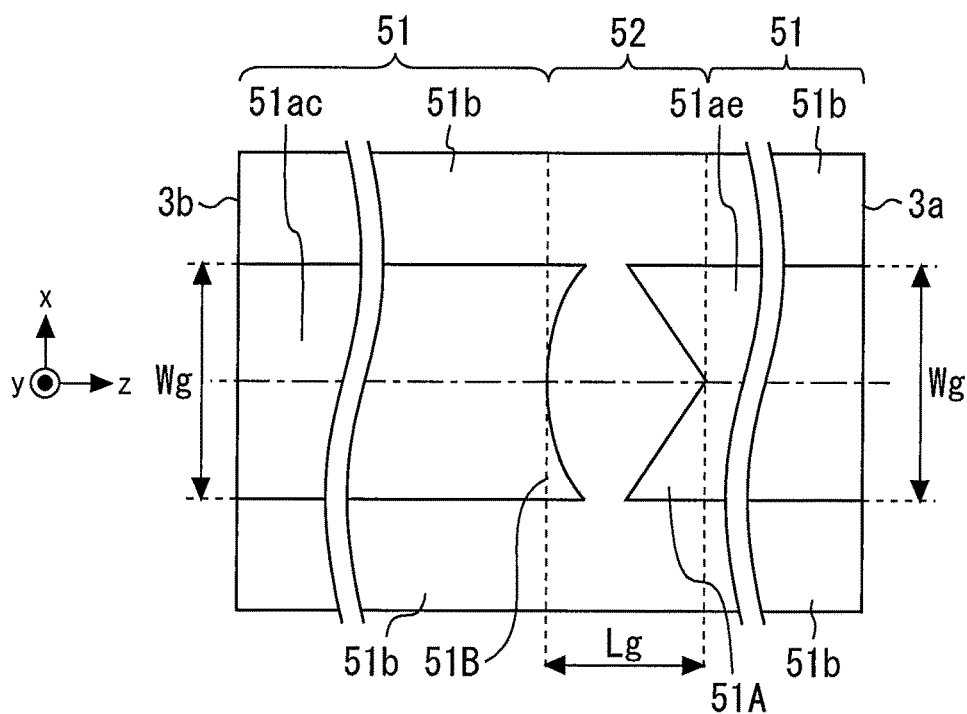
FIG. 20 is a plan view of a device according to a third modified example.

FIG. 20 is a plan view of a gain waveguide type broad area semiconductor laser device according to a third modified example of the third embodiment. This third modified example of the third embodiment differs from the second modified example of the third embodiment in that the recessed portion 51A is provided on a portion of an active region 51ae, which contacts the filter region 52. The filter region 52 in the third modified example protrudes with respect to the active region 51ae on the front end surface 3a side, and protrudes with respect to the active region 51ac on the rear end surface 3b side. By having the filter region 52 protrude toward the front end surface 3a, the light emitted from the active region 51ae largely diverges in the positive and negative directions of x at the filter region 52, and thus will not easily enter the opposing active region 51ac. As a result, a great filter effect can be expected.

Figure 21:
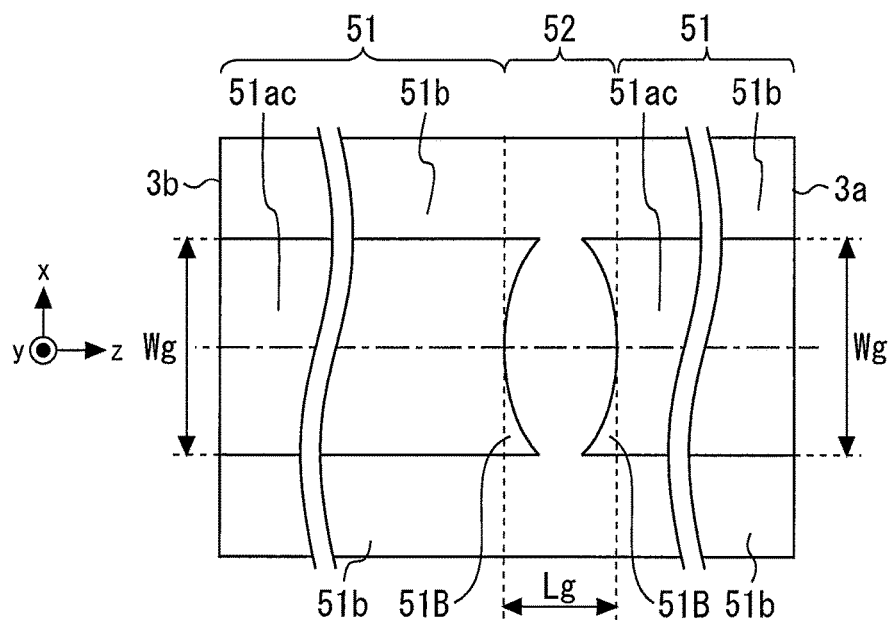
FIG. 21 is a plan view of a device according to a fourth modified example.

FIG. 21 is a plan view of a gain waveguide type broad area semiconductor laser device according to a fourth modified example of the third embodiment. The active region 51ac on the left side of the filter region 52 has a recessed portion 51B, and the active region 51ac on the right side of the filter region 52 also has a recessed portion 51B. Therefore, a great filter effect with respect to higher order modes can also be expected, similar to the third modified example. A recessed portion having the same shape as the recessed portion 51A shown in FIG. 20 may also be provided in the active regions on the left and right sides of the filter region 52.

The broad area semiconductor laser device according to the third embodiment of the present invention may also be modified in a variety of ways as long as the characteristics of the device are not lost. For example, with a structure that differs from the structure shown in FIG. 17, the laser device may also be a gain waveguide type. The shape of the recessed portion of the active region is not particularly limited as long as the normal line of the end portion of the active region is inclined with respect to the z-axis.

Fourth Embodiment

Figure 22:
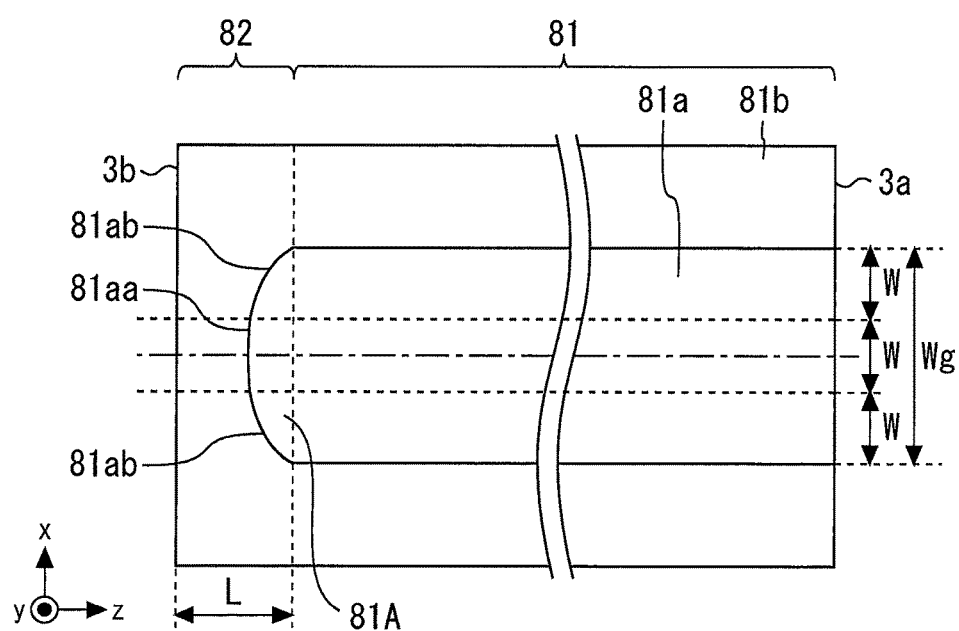
FIG. 22 is a plan view of a broad area semiconductor laser device according to a fourth embodiment.

FIG. 22 is a plan view of a broad area semiconductor laser device according to a fourth embodiment. This device may be either a refractive index waveguide type or a gain waveguide type. This device is characterized by the shape of the active region.

A waveguide region 81 has an effective refractive index of ne or an effective complex refractive index of ne*. The waveguide region 81 includes an active region 81a having a width of Wg, and a cladding region 81b that sandwiches the active region 81a. A filter region 82 is provided contacting the rear end surface 3b. The length of the filter region 82 is L, and the effective refractive index is of or the effective complex refractive index is nf*.

The active region 81a has a protruding portion 81A at a boundary portion with the filter region 82. The curvature of the curve of the boundary between the active region 81a and the filter region 82 is greater at both end portions of the curve than at a central portion of the curve. That is, the protruding portion 81A has a small curvature portion 81aa, and two large curvature portions 81ab that sandwich the small curvature portion 81aa. The small curvature portion 81aa is positioned at the central portion of the active region 81a, and the large curvature portions 81ab are positioned to the outsides of the central portion.

With both the refractive index waveguide type and the gain waveguide type, light diverges more in the cladding region 81b as the order of mode is higher. When the curvature near the center of the active region 81a is reduced by providing the small curvature portion 81aa, and the curvature towards the outsides of the center is increased by providing the large curvature portion 81ab, as in this embodiment, lower order modes are greatly affected by the small curvature near the center, while higher order modes are greatly affected by the large curvature of the outsides. Therefore, in the filter region 82, since lower order modes will not diverge much while higher order modes will diverge more, higher order modes are able to be selectively filtered. As a result, higher order modes are able to be suppressed without increasing the length of the filter region 82.

The characteristics of the broad area semiconductor laser device according to the embodiments described heretofore may also be suitably combined.

According to the present invention, light is made to diverge more at the filter region as the order of mode is higher, by making an active region protrude or recess with respect to the filter region. As a result, higher order modes of the filter region tend not to couple with the active region. Consequently, higher order modes are able to be suppressed without increasing the length of the filter region.

Obviously many modifications and variations of the present invention are possible in the light of the above teachings. It is therefore to be understood that within the scope of the appended claims the invention may be practiced otherwise than as specifically described.

What is claimed is:

1. A refractive index waveguide type broad area semiconductor laser device, comprising:
a resonator that has a front end surface and a rear end surface, and includes a waveguide region and a filter region,
wherein an effective refractive index of the waveguide region is smaller than an effective refractive index of the filter region;
the waveguide region includes an active region adjacent to and coupled to the filter region in such a way that a propagation path through the waveguide region and the filter region is in a same plane, the active region having a width of W and a refractive index of $n_a$, and into which current is injected, and a cladding region that is provided to an outside of the active region, and has a refractive index of $n_c$ that is smaller than the $n_a$;
the filter region has an effective refractive index that is uniform in a direction perpendicular to a longitudinal direction of the resonator;
a plurality of modes are allowed by the following expression being satisfied:

$$\left[\frac{2\pi}{\lambda}\right]\sqrt{n_a^2 - n_c^2}\left[\frac{W}{2}\right] > \frac{\pi}{2},$$

when a wavelength of a laser beam emitted from the resonator is $\lambda$; and
the active region protrudes with respect to the filter region when viewed from above.

2. The broad area semiconductor laser device according to claim 1, wherein a boundary between the active region and the filter region is linear.

3. The broad area semiconductor laser device according to claim 1, wherein a boundary between the active region and the filter region is a curve.

4. The broad area semiconductor laser device according to claim 3, wherein a curvature of the curve is larger at both end portions of the curve than at a central portion of the curve.

5. The broad area semiconductor laser device according to claim 1, wherein the filter region is provided contacting the rear end surface.

6. The broad area semiconductor laser device according to claim 1, wherein the filter region does not contact either the front end surface or the rear end surface.

7. The broad area semiconductor laser device according to claim 6, wherein the active region protrudes with respect to the filter region at a portion that contacts the front end surface side of the filter region, and protrudes with respect to the filter region at a portion that contacts the rear end surface side of the filter region.

8. A refractive index waveguide type broad area semiconductor laser device, comprising:
a resonator that has a front end surface and a rear end surface, and includes a waveguide region and a filter region,
wherein an effective refractive index of the waveguide region is larger than an effective refractive index of the filter region;
the waveguide region includes an active region adjacent to and coupled to the filter region in such a way that a propagation path through the waveguide region and the filter region is in a same plane, the active region having a width of W and a refractive index of $n_a$, and into which current is injected, and a cladding region that is provided to an outside of the active region, and has a refractive index of $n_c$ that is smaller than the $n_a$;
a plurality of modes are allowed by the following expression being satisfied:

$$\left[\frac{2\pi}{\lambda}\right]\sqrt{n_a^2 - n_c^2}\left[\frac{W}{2}\right] > \frac{\pi}{2},$$

when a wavelength of a laser beam emitted from the resonator is $\lambda$; and the filter region protrudes with respect to the active region when viewed from above.

9. The broad area semiconductor laser device according to claim 8, wherein a boundary between the active region and the filter region is linear.

10. The broad area semiconductor laser device according to claim 8, wherein a boundary between the active region and the filter region is a curve.

11. The broad area semiconductor laser device according to claim 8, wherein the filter region is provided contacting the rear end surface.

12. The broad area semiconductor laser device according to claim 8, wherein the filter region does not contact either the front end surface or the rear end surface.

13. The broad area semiconductor laser device according to claim 12, wherein the filter region protrudes with respect to the active region on the front end surface side, and protrudes with respect to the active region on the rear end surface side.

14. A gain waveguide type broad area semiconductor laser device, comprising:

a resonator that has a front end surface and a rear end surface, and includes a waveguide region, and a filter region into which current is not injected, wherein the waveguide region includes an active region adjacent to and coupled to the filter region and into which current is injected in such a way that a propagation path through the waveguide region and the filter region is in a same plane, and a cladding region that is provided to an outside of the active region and into which current is not injected; and the filter region protrudes with respect to the active region when viewed from above.

15. The broad area semiconductor laser device according to claim 14, wherein a boundary between the active region and the filter region is linear.

16. The broad area semiconductor laser device according to claim 14, wherein a boundary between the active region and the filter region is a curve.

17. The broad area semiconductor laser device according to claim 14, wherein the filter region is provided contacting the rear end surface.

18. The broad area semiconductor laser device according to claim 14, wherein the filter region does not contact either the front end surface or the rear end surface.

19. The broad area semiconductor laser device according to claim 18, wherein the filter region protrudes with respect to the active region on the front end surface side, and protrudes with respect to the active region on the rear end surface side.

* * * * *